United States Patent
Oster et al.

(10) Patent No.: US 10,969,574 B2
(45) Date of Patent: Apr. 6, 2021

(54) PROCESS FOR CREATING PIEZO-ELECTRIC MIRRORS IN PACKAGE

(71) Applicant: Intel Corporation, Santa Clara, CA (US)

(72) Inventors: Sasha N. Oster, Marion, IA (US); Feras Eid, Chandler, AZ (US); Johanna M. Swan, Scottsdale, AZ (US); Shawna M. Liff, Scottsdale, AZ (US); Aleksandar Aleksov, Chandler, AZ (US); Thomas L. Sounart, Chandler, AZ (US); Baris Bicen, Chandler, AZ (US); Valluri R. Rao, Saratoga, CA (US)

(73) Assignee: Intel Corporation, Santa Clara, CA (US)

( * ) Notice: Subject to any disclaimer, the term of this patent is extended or adjusted under 35 U.S.C. 154(b) by 287 days.

(21) Appl. No.: 16/072,157

(22) PCT Filed: Apr. 1, 2016

(86) PCT No.: PCT/US2016/025653
§ 371 (c)(1),
(2) Date: Jul. 23, 2018

(87) PCT Pub. No.: WO2017/171854
PCT Pub. Date: Oct. 5, 2017

(65) Prior Publication Data
US 2019/0033575 A1    Jan. 31, 2019

(51) Int. Cl.
*G02B 26/00*    (2006.01)
*G02B 26/08*    (2006.01)
*H01L 41/047*   (2006.01)
*H01L 41/27*    (2013.01)
*H01L 41/314*   (2013.01)
*H01L 41/332*   (2013.01)

(52) U.S. Cl.
CPC ........ *G02B 26/0858* (2013.01); *H01L 41/047* (2013.01); *H01L 41/27* (2013.01); *H01L 41/314* (2013.01); *H01L 41/332* (2013.01)

(58) Field of Classification Search
CPC ............ G02B 26/0858; G02B 26/0833; G02B 26/08; G02B 26/0825
See application file for complete search history.

(56) References Cited

U.S. PATENT DOCUMENTS 5,745,278 A     4/1998  La Fiandra
2002/0020053 A1 * 2/2002 Fonash ............... B81C 1/00119
                                                      29/623.1

(Continued)

FOREIGN PATENT DOCUMENTS

TW     201539812      10/2015

OTHER PUBLICATIONS

International Preliminary Report on Patentability for International Patent Application No. PCT/US2016/025653, dated Oct. 11, 2018, 10 pages.

(Continued)

*Primary Examiner* — Joseph P Martinez
(74) *Attorney, Agent, or Firm* — Schwabe, Williamson & Wyatt P.C.

(57) ABSTRACT

Embodiments of the invention include a piezo-electric mirror in an microelectronic package and methods of forming the package. According to an embodiment the microelectronic package may include an organic substrate with a cavity formed in the organic substrate. In some embodiments, an actuator is anchored to the organic substrate and extends over the cavity. For example, the actuator may include a first electrode and a piezo-electric layer formed on the first electrode. A second electrode may be formed on the piezo-electric layer. Additionally, a mirror may be formed on (Continued)

the actuator. Embodiments allow for the piezo-electric layer to be formed on an organic package substrate by using low temperature crystallization processes. For example, the piezo-electric layer may be deposited in an amorphous state. Thereafter, a laser annealing process that includes a pulsed laser may be used to crystallize the piezo-electric layer.

25 Claims, 14 Drawing Sheets

(56) References Cited

U.S. PATENT DOCUMENTS

| | | |
|---|---|---|
| 2002/0071169 A1 | 6/2002 | Bowers et al. |
| 2006/0152830 A1 | 7/2006 | Farah |
| 2010/0117761 A1 | 5/2010 | Floyd |
| 2011/0032590 A1* | 2/2011 | Terada ............... H01L 41/0953 359/199.4 |
| 2011/0205720 A1 | 8/2011 | Lee et al. |
| 2015/0072084 A1 | 3/2015 | Mimoun et al. |
| 2019/0140158 A1 | 5/2019 | Eid |

OTHER PUBLICATIONS

Search Report for European Patent Application No. 16897393.1, dated Nov. 27, 2019, 7 pgs.
International Search Report and Written Opinion for International Patent Application No. PCT/US2016/025653 dated Dec. 22, 2016, 13 pgs.

* cited by examiner

PROCESS FOR CREATING PIEZO-ELECTRIC MIRRORS IN PACKAGE

CROSS-REFERENCE TO RELATED APPLICATION

This patent application is a U.S. National Phase Application under 35 U.S.C. § 371 of International Application No. PCT/US2016/025653, filed Apr. 1, 2016, entitled "PROCESS FOR CREATING PIEZO-ELECTRIC MIRRORS IN PACKAGE," which designates the United States of America, the entire disclosure of which is hereby incorporated by reference in its entirety and for all purposes.

FIELD OF THE INVENTION

Embodiments of the present invention relate generally to the manufacture of piezo-electric mirrors. In particular, embodiments of the present invention relate to piezo-electric mirrors that are formed in organic packages and methods for manufacturing such devices.

BACKGROUND OF THE INVENTION

Many devices today employ small, steerable mirrors. Such devices include projection display systems, microscanners, optical communications, and other optical beam-steering systems. These mirrors are typically silicon microelectromechanical systems (MEMS) based devices. Micromirrors can employ electrostatic, piezo-electric, or magnetic actuation and are often fabricated using silicon MEMS techniques. With respect to mirrors actuated using high performance piezo-electric films, it is not currently possible to replace semiconductor fabrication with low-temperature materials, such as organic substrates. High performance piezo-electric materials are limited to being formed on high-temperature compatible substrates because an annealing process is needed to crystallize the piezo-electric layer. Typically, the annealing temperatures are in excess of 500° C. As such, low-temperature substrates, such as organic substrates, cannot currently be used to form high performance piezo-electric systems because the elevated temperatures may melt or otherwise damage the substrate. Additionally, silicon MEMS are often fabricated at wafer level. Therefore, fabrication of piezo-electric mirrors on silicon cannot take advantage of scaling to larger substrates due to the limitation on wafer sizes (e.g., 4" or 6"). Furthermore, silicon MEMS or other semiconductor MEMS mirror devices need to be packaged and then assembled into their final system. Therefore, MEMS mirrors today suffer from high cost, assembly challenges, and larger overall size due to the added packaging required.

DETAILED DESCRIPTION OF THE INVENTION

Figure 1A:
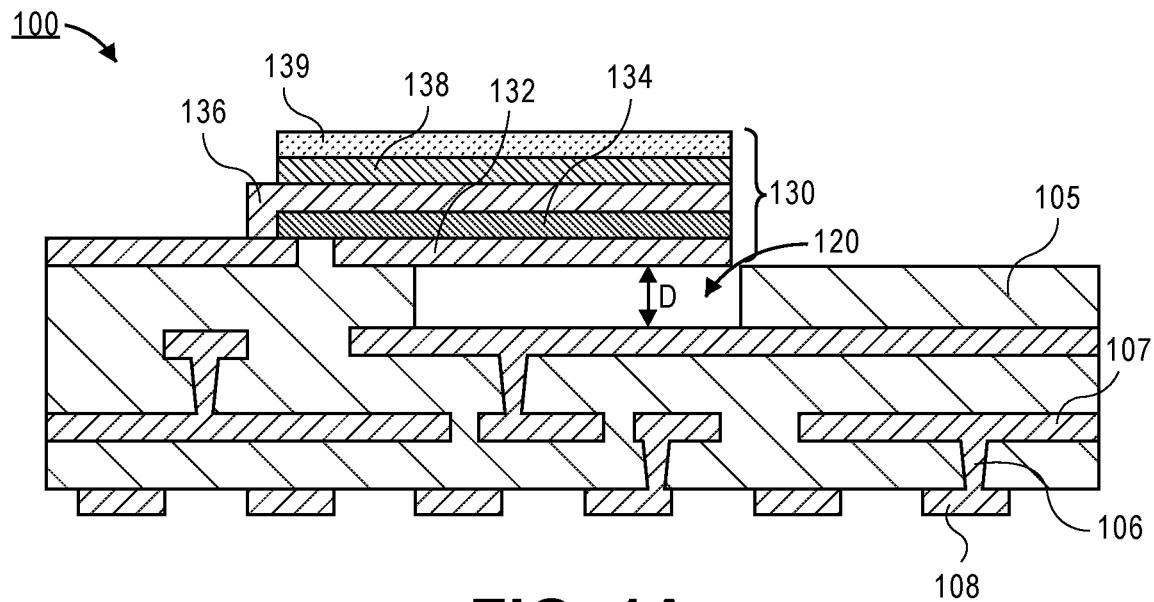
FIG. 1A is a cross-sectional illustration of a piezo-electric mirror formed on an organic substrate, according to an embodiment of the invention.

Described herein are systems that include a piezo-electric mirror formed on an organic substrate and methods of forming such piezo-electric mirrors. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention; however, the order of description should not be construed to imply that these operations are necessarily order dependent. In particular, these operations need not be performed in the order of presentation.

Embodiments of the invention allow for piezo-electrically driven mirrors to be integrated into organic substrates. This is achieved by integrating a piezo-electric material and a reflector (e.g., a mirror) into the manufacturing process flow of a microelectronic-package substrate or board. The piezo-electric and reflector layers are then released by removing the surrounding organic material so that the mirror can move upon actuation. By applying a voltage across the piezo-electric layer, the mirror can be actuated in one or more directions. Forming piezo-electric mirrors on organic substrates provides significant advantages compared to the piezo-electric devices described above that are formed on semiconducting materials.

One advantage is that manufacturing piezo-electrically actuated mirrors on organic substrates allows for a decrease in the manufacturing cost. For example, technologies and materials developed for package/board processing are significantly less expensive than technologies and materials used for semiconductor processing. Fabricating steerable mirrors directly in the substrate or board reduces the cost over silicon MEMS because of the large panels (e.g., 510 mm×515 mm) used for organic substrate and board fabrication, the less expensive processing operations, and the less expensive materials used in those systems compared to silicon MEMS. In addition, since the mirrors are directly manufactured as part of the package substrate or board, they do not require an additional packaging or assembly operation. Furthermore, large numbers of mirrors could be integrated into a single system more cost-effectively than would be possible with silicon MEMS approaches. Additionally, the overall thickness is very small (e.g., in the tens of micrometers) since additional packaging needed for silicon MEMS devices is not required.

Referring now to FIG. 1A, a cross-sectional illustration of a microelectronic package 100 is shown, according to an embodiment of the invention. As illustrated, the microelectronic package 100 includes an organic substrate 105. In an embodiment, the organic substrate 105 may be any suitable organic material. By way of example, the dielectric layer may be a polymer material, such as, for example, polyimide, epoxy, or build-up film. The organic substrate 105 may include one or more layers (i.e., build-up layers). According to an embodiment, the microelectronic package 100 may also include one or more conductive traces 107, vias 106, and pads 108 to provide electrical routing in the organic substrate 105. The conductive traces 107, vias 106, and pads 108 may be any suitable conductive material typically used in organic packaging applications (e.g., copper, tin, aluminum, alloys of conductive materials, and may also include multiple layers, such as seed layers, barrier layers, or the like).

According to an embodiment, the microelectronic package 100 may include an actuator 130. The actuator 130 may be anchored to the organic substrate 105 and oriented so that it extends over a cavity 120 formed in the organic substrate 105. The cavity 120 may be sized so that it is larger than the actuator 130 in order to allow the actuator 130 to be displaced into the cavity 120. According to an embodiment, the depth D of the cavity 120 may be chosen to allow for the desired amount of displacement of the actuator 130 into the cavity 120. For example, increasing the depth D allows for greater displacement of the actuator 130. Additional embodiments may include a cavity 120 sized to accommodate a plurality of actuators 130 formed on the same organic substrate 105.

According to an embodiment, the actuator 130 includes a piezo-electric layer 134 formed between a first electrode 132 and a second electrode 136. High performance piezo-electric material typically requires a high temperature anneal (e.g., greater than 500° C.) in order to attain the proper crystal structure to provide the piezo-electric effect. As such, previous piezo-electrically actuated mirrors, such as those described above, require a substrate that is capable of withstanding high temperatures (e.g., silicon). Organic substrates, such as those described herein, typically cannot withstand temperatures above 260° C. However, embodiments of the present invention allow for a piezo-electric layer 134 to be formed at much lower temperatures. For example, instead of a high temperature anneal, embodiments include depositing the piezo-electric layer 134 in an amorphous phase and then using a pulsed laser to crystallize the piezo-electric layer 134. According to an embodiment, the pulsed laser annealing process may use an excimer laser with an energy density between approximately 10-100 mJ/cm$^2$ and a pulsewidth between approximately 10-50 nanoseconds. For example, the piezo-electric layer 134 may be deposited with a sputtering process, an ink jetting process, or the like. According to an embodiment, the piezo-electric layer may be lead zirconate titanate (PZT), potassium sodium niobate (KNN), zinc oxide (ZnO), or combinations thereof.

The first electrode 132 and the second electrode 136 may be electrically coupled to a voltage source by conductive traces 107 in the microelectronic package. As such, a voltage applied across the first electrode 132 and the second electrode 136 may be generated. The voltage applied across the first electrode 132 and the second electrode 136 induces a strain in the piezo-electric layer 134 that causes displacement of the actuator 130. In an embodiment, the displacement of the actuator 130 is proportional to the voltage across the first electrode 132 and the second electrode 136, as will be described in greater detail below. In FIG. 1A, the piezo-electric layer 134 and the second electrode 136 are formed over the entire top surface of the first electrode 132, though embodiments are not limited to such configurations.

According to an embodiment, the first electrode 132 and the second electrode 136 are formed with a conductive material. In some embodiments, the first electrode 132 and the second electrode 136 may be formed with the same conductive material used to form the conductive traces 107, vias 106, and pads 108 formed in the organic substrate 105. Such an embodiment allows for the manufacturing of the microelectronic package to be simplified since additional materials are not needed, though embodiments are not limited to such configurations. For example, the electrodes 132, 136 may be different materials than the traces 106. Additional embodiments may include a first electrode 132 that is a different material than the second electrode 136. The conductive material used for the first electrode 132 and the second electrode 136 may be any conductive material (e.g., copper, aluminum, alloys, etc.).

According to an embodiment, a mirror 138 may be formed on the actuator 130. In the illustrated embodiment, the mirror 138 may substantially cover a top surface of the second electrode 136. As such, displacing the actuator 130 allows for the mirror 138 to be displaced as well. The mirror 138 may be sized to capture a beam that will be reflected by the mirror 138. Minimizing the size of the mirror 138 and the actuator 130 may allow for more mirrors to be formed in a given area, allow for the mirror to be driven with less power, or allow for additional components or electronics to be formed on the microelectronic package 100. For example, the mirror 138 may have a surface area between approximately 50 μm-100 μm by 200 μm-500 μm, though mirrors 138 that have smaller or larger surface areas may also be formed according to embodiments of the invention.

According to an embodiment, the mirror 138 may have a surface roughness that is less than approximately 300 nm. Additional embodiments may include mirror 138 that has a surface roughness that is less than approximately 100 nm. Yet another embodiment may have a surface roughness that is less than approximately 10 nm. The surface roughness may be dictated by the deposition techniques used to form the mirror 138. Additionally, surface treatments may be used to further reduce the surface roughness of the mirror 138. According to an embodiment, the mirror 138 may be any reflective material. For example, the mirror 138 may be aluminum, silver, gold, tin, alloys of reflective materials, or the like. Additional embodiments may include choosing the material or surface treatment of the mirror 138 to provide wavelength selective or polarizing effects. For example, gold may be used to filter out wavelengths (e.g., the wavelengths approximately 550 nm or less). According to an embodiment, a protective coating 139 may be formed over the mirror 138 to prevent oxidation or other damage. For example, the protective coating may be any optically clear material. Additionally, the protective coating 139 may be used as an anti-reflective coating, a filter, or a polarizer.

While a distinct material layer is illustrated in FIG. 1A as being the mirror 138, embodiments may also include using a top surface of an electrode 132/136 as the mirror 138. For example, in typical microelectronic packaging operations, copper may be deposited with a surface roughness of approximately 100 nm, and the surface roughness is then increased with a surface roughening operation in order to increase the adhesion between layers. In an embodiment, the surface roughing operation may be omitted and the copper with a surface roughness of approximately 100 nm may be used as the mirror 138.

Figure 1B:
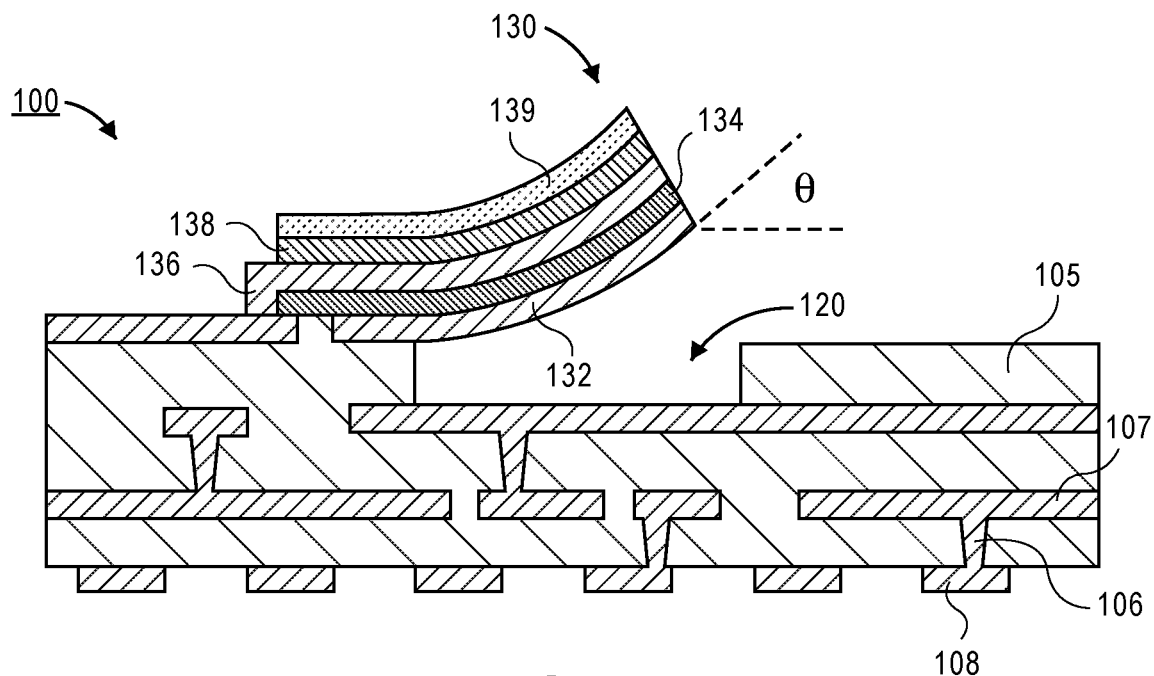
FIG. 1B is a cross-sectional illustration of a piezo-electric mirror in FIG. 1A that is being actuated, according to an embodiment of the invention.

Referring now to FIG. 1B, a cross-sectional illustration of a microelectronic package 100 with an actuator 130 in an actuated state is shown, according to an embodiment of the invention. The actuator 130 may be displaced by applying a voltage across the first electrode 132 and the second electrode 136. The voltage produces strain in the piezo-electric layer 134 that causes the actuator 130 to displace towards or away from the substrate 105, depending on the bias of the voltage.

As illustrated in FIG. 1B, the actuator 130 is deflected away from substrate 105 at an angle θ. The deflection angle θ may be proportional to the voltage across the first electrode 132 and the second electrode 136. In an embodiment, the deflection angle θ is limited by the plastic deformation of the first and second electrodes 132, 136 (i.e., the angle θ may be up to the point where the deformation regime of the actuator changes from elastic deformation to plastic deformation). For example, the deflection angle θ may be approximately 30° or less when copper is used for the first and second electrodes 132, 136. However, it is to be appreciated that deflection angles of approximately 10° or less may be obtained by applying voltages between approximately 10-20 volts, depending on the geometry of the actuator 130.

Embodiments of the invention are also not limited to digital responses (i.e., maximum deflection or no deflection). Instead, the actuator 130 may be deflected in an analog manner to any deflection angle less than the maximum deflection angle θ. Accordingly, embodiments of the invention may allow for incoming beams to be reflected to more than one location. This provides significant advantages for designing products like optical switches, displays, microscanners, or the like. In an embodiment, the displacement of the mirror 138 may be static (e.g., by applying a constant voltage to the piezo-electric layer 134). Additional embodiments include dynamic displacement of the mirror 138 (e.g., by applying a frequency dependent voltage to the piezo-electric layer 134 to produce a resonant vibration of the actuator 130). As such, the actuator 130 may be operated at a resonant frequency that allows for lower overall power consumption.

Figure 2A:
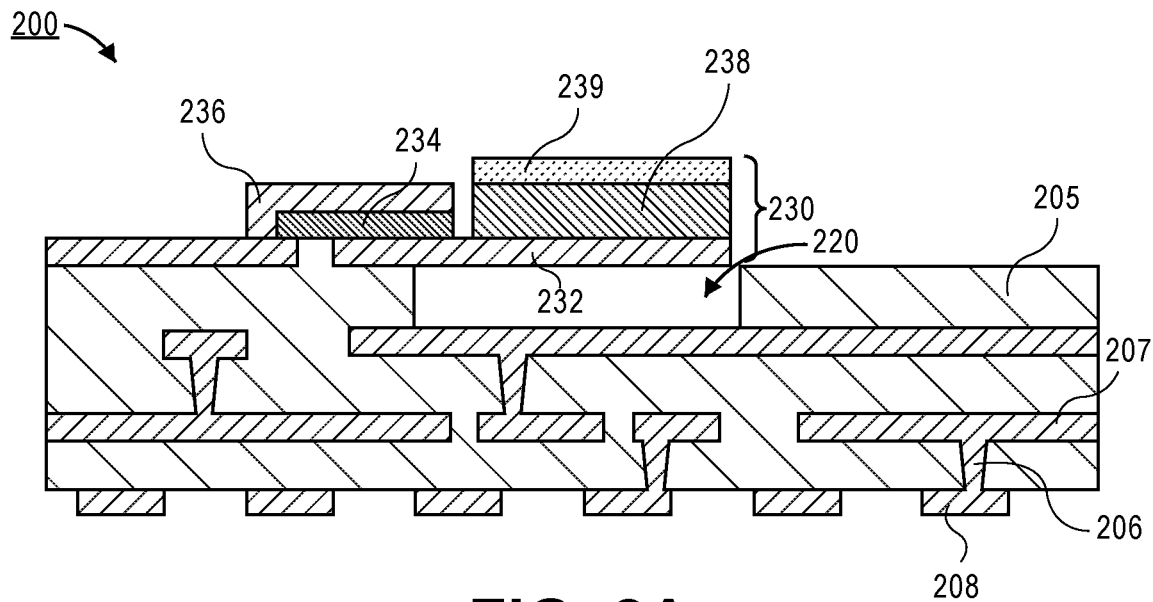
FIG. 2A is a cross-sectional illustration of a piezo-electric mirror formed on an organic substrate, according to an additional embodiment of the invention.

Referring now to FIG. 2A, a cross-sectional illustration of a microelectronic package 200 with an actuator 230 is shown, according to an additional embodiment of the invention. Microelectronic package 200 is substantially similar to the microelectronic package 100 illustrated in FIGS. 1A and 1B, with the exception that the piezo-electric layer 234 and the second electrode 236 do not extend over the entire top surface of the first electrode 232. According to an embodiment, the piezo-electric layer 234 and the second electrode 236 may still extend over at least a portion of the cavity 220. Extending the piezo-electric layer 234 over the cavity allows for the actuator 230 to be deflected when a voltage is applied to the first and second electrodes 232, 236, as will be described below.

In such an embodiment, the first electrode 232 may function as a pad on which the mirror 238 may be formed. As illustrated, the mirror is formed over a portion of the exposed first electrode 232, though embodiments are not limited to such configurations. For example, the mirror 238 may be formed over substantially the entire top surface of the first electrode 232 that is not covered by the piezo-electric layer 234.

Figure 2B:
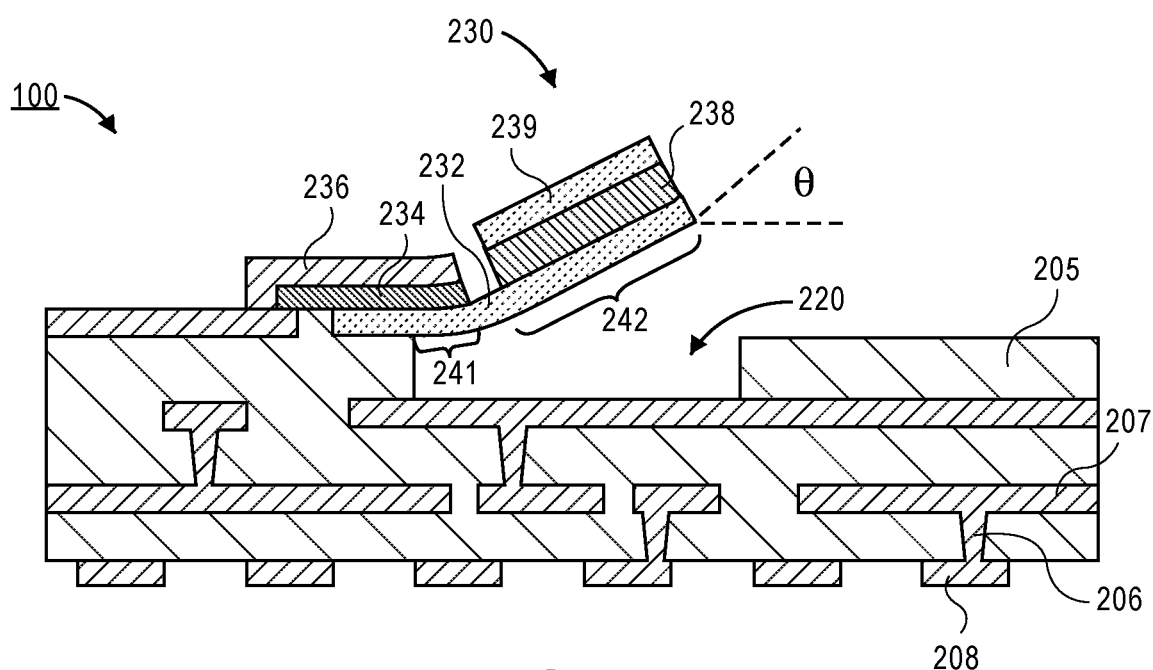
FIG. 2B is a cross-sectional illustration of the piezo-electric mirror in FIG. 2A being actuated, according to an embodiment of the invention.

Referring now to FIG. 2B, a cross-sectional illustration of a microelectronic package 200 with an actuator 230 in an actuated state is shown, according to an embodiment of the invention. Similar to the deflection of the actuator 130 described above, applying a voltage across the first and second electrodes 232, 236 produces a strain in the piezo-electric layer 234 that causes the actuator 230 to deflect away from or towards the organic substrate 205. An advantage to not extending the piezo-electric layer 234 entirely across the top surface of the first electrode 232 is that the deflection becomes more linear. As illustrated, the actuator 130 includes a non-linear (e.g., curved) portion 241 where the piezo-electric layer 234 is formed and a linear portion 242 where there is no piezo-electric layer 234. Accordingly, the mirror 238 may be formed on a surface that does not curve when the actuator deflects.

Figure 3:
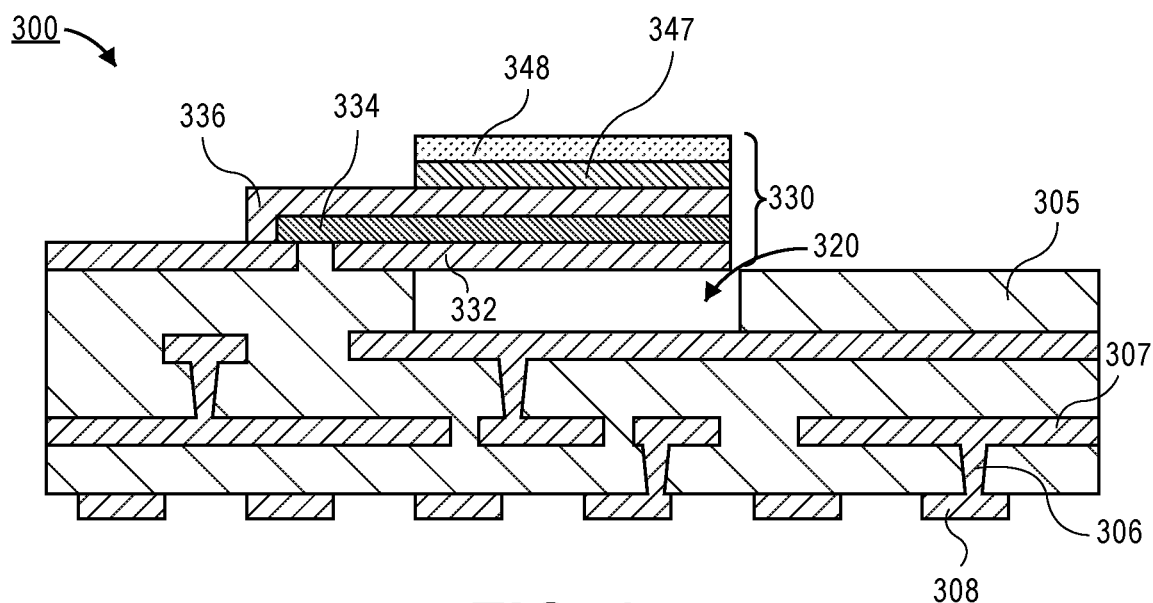
FIG. 3 is a cross-sectional illustration of a reflective die that is mounted to a piezo-electric actuated structure, according to an embodiment of the invention.

According to an additional embodiment of the invention, the mirror formed on the actuator may also be a discrete component that is bonded to the actuator instead of being deposited onto the actuator. An actuator according to such an embodiment is shown in the cross-sectional illustration in FIG. 3. The microelectronic package 300 illustrated in FIG. 3 is substantially similar to the microelectronic package 100 illustrated in FIGS. 1A and 1B, with the exception that the mirror 348 is a discrete component. In one embodiment, the mirror 348 may be a die that is mounted to the actuator 330 with a bonding layer 347. For example, the bonding layer 347 may be an epoxy, a solder, or the like. Forming the mirror 348 as a discrete die may allow for a plurality of mirrors 348 to be fabricated on a substrate other than the organic substrate 305, and then each mirror 348 may be mounted to an actuator 330 with a pick and place tool, or any other mounting technique. Forming the mirror 348 as a discrete component may also allow for more complex mirrors to be used without significantly decreasing the throughput. For example, the mirrors 348 may be fabricated to include filters, polarizers, or the like. Additionally, forming the mirror as a discrete component may allow for more complex mirror shapes, such as concave or convex mirrors. In addition to using a die for the mirror 348, embodiments may also include a mirror 348 that is a thin sheet of reflective material (e.g., aluminum, silver, gold, tin, alloys of reflective materials, etc.).

Figure 4A:
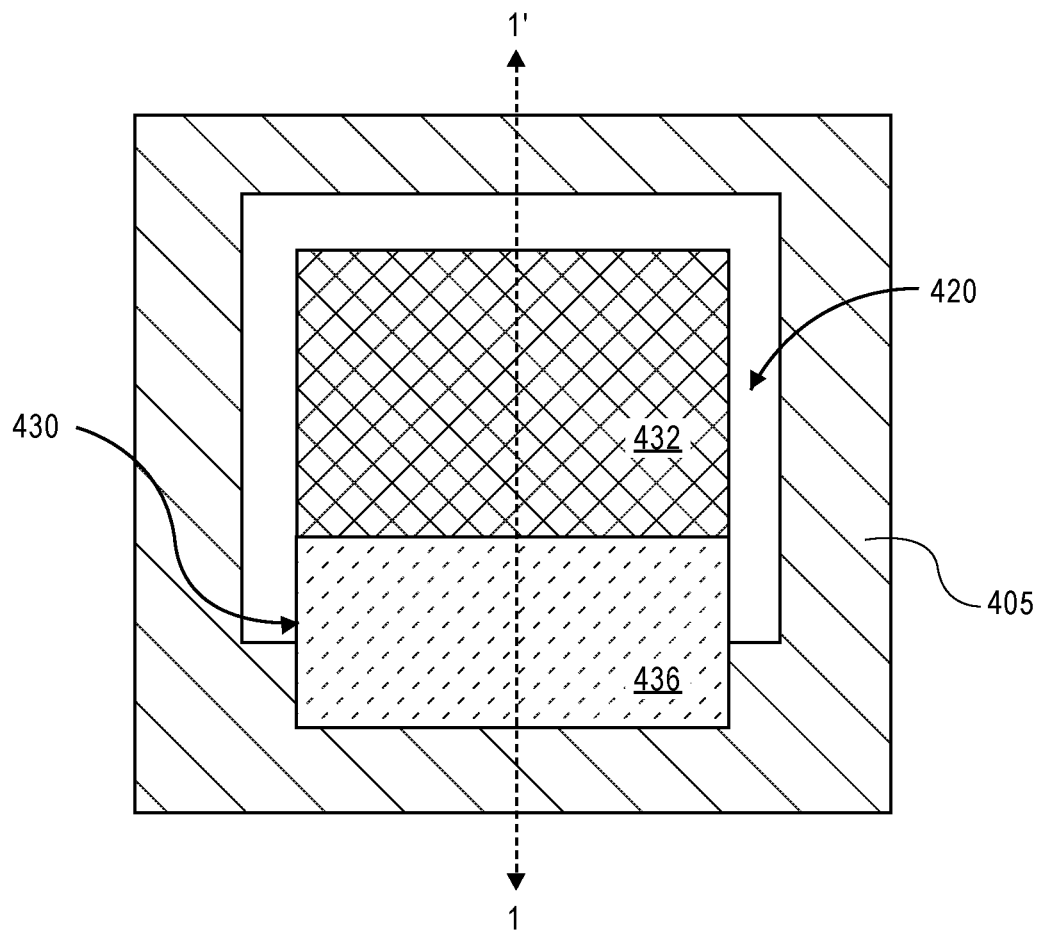
FIG. 4A is a plan view of a piezo-electric actuated structure that includes an actuator with a piezo-electric layer and a second electrode that extend along an edge of a pad region of the first electrode, according to an embodiment of the invention.
Figure 4B:
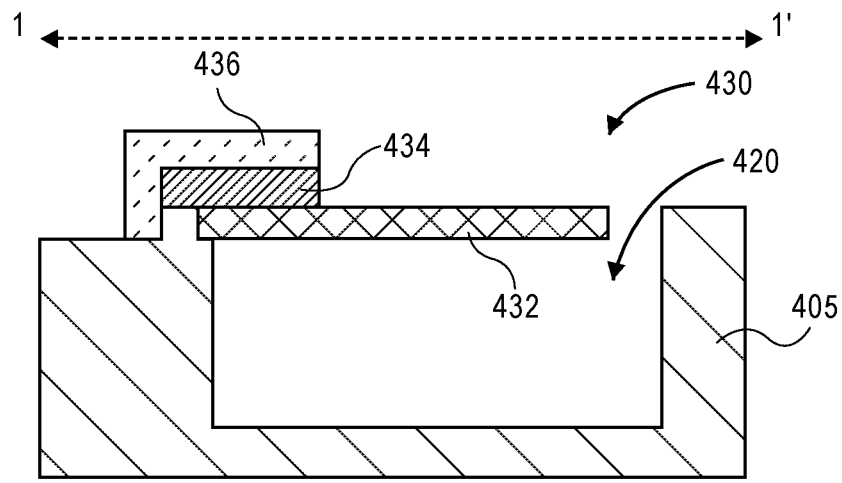
FIG. 4B is a cross-sectional illustration of the piezo-electric actuated structure in FIG. 4A along line 1-1', according to an embodiment of the invention.

Referring now to FIGS. 4A and 4B, a plan view illustration and a corresponding cross-sectional illustration are shown that more clearly illustrate how an actuator 430 is anchored to the organic substrate 405, according to an embodiment of the invention. In order to not obscure the actuator 430, the mirror is omitted. However, it is to be appreciated that the mirror may be mounted or formed on the actuator 430 similar to the actuators described above. As illustrated in the plan view in FIG. 4A, the second electrode 436 extends out from the organic substrate 405 over the cavity 420. According to an embodiment, the width of the first and second electrodes 432/436 may be substantially equal to each other. As such, the second electrode 436 and the piezo-electric layer (not visible in FIG. 4A) extend substantially along an entire edge of the first electrode 432. Referring now to FIG. 4B, a cross-sectional view along line 1-1' further illustrates the piezo-electric layer 434 extending out from the organic substrate 405 over the cavity 420. From the cross-sectional view, it is apparent that the actuator 430 forms a cantilever beam that can be deflected into the cavity 420 or away from the organic substrate 405.

In order to not unnecessarily obscure the view of the actuator 430 in FIGS. 4A and 4B, conductive features (e.g., vias, traces, etc.) that may be formed in the organic substrate have been omitted. However, it is to be appreciated that the electrodes 432/436 of the actuator 430 may be electrically coupled to a voltage source by one or more traces and/or vias. Similarly, some Figures described below may also omit the conductive features formed in the organic substrate for purposes of clarity, but it is to be appreciated that embodiments of the invention may include conductive features for coupling the electrodes of the actuator to a voltage source.

Figure 5A:
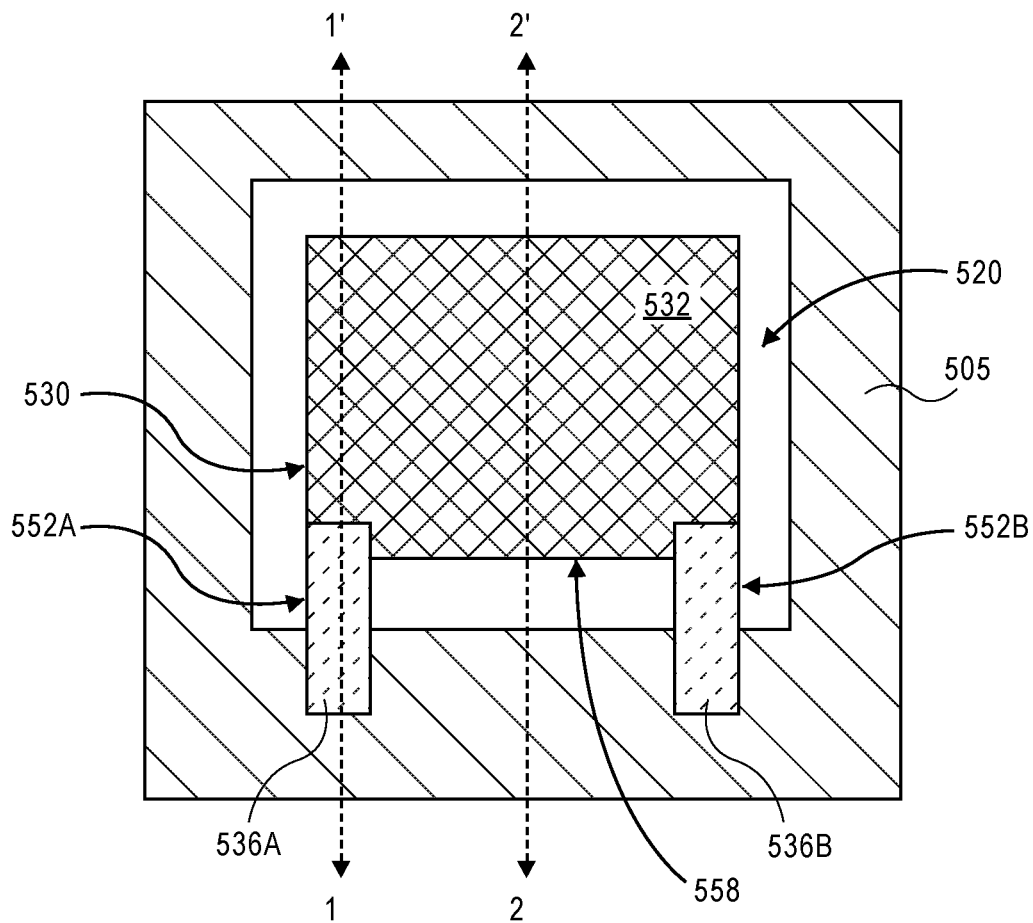
FIG. 5A is a plan view of a piezo-electric actuated structure that includes two actuation arms, according to an embodiment of the invention.
Figure 5B:
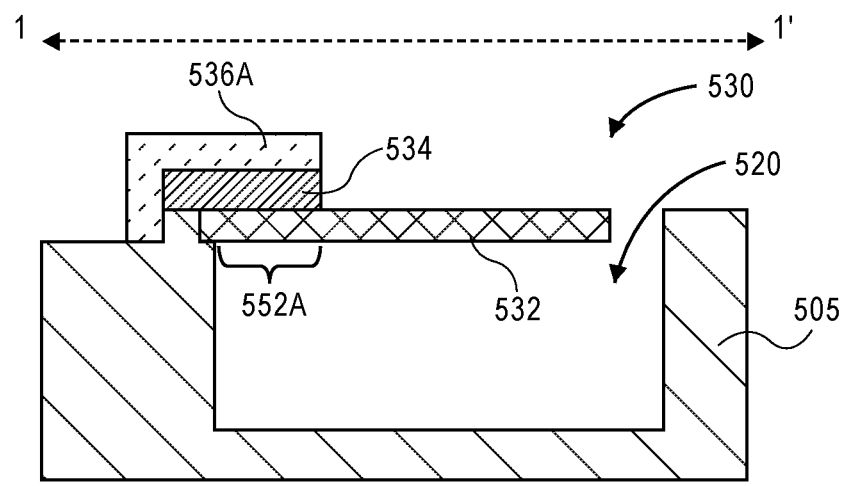
FIG. 5B is a cross-sectional illustration of the piezo-electric actuated structure in FIG. 5A along line 1-1', according to an embodiment of the invention.
Figure 5C:
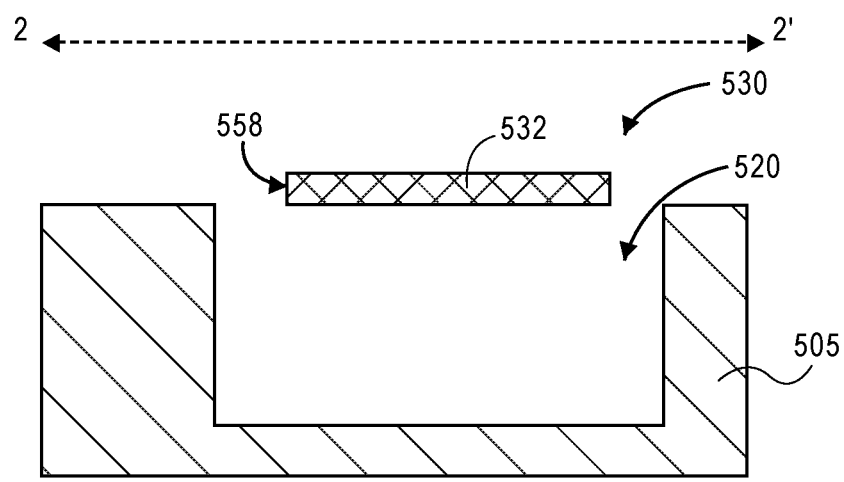
FIG. 5C is a cross-sectional illustration of the piezo-electric actuated structure in FIG. 5A along line 2-2', according to an embodiment of the invention.

Referring now to FIGS. 5A-5C, a plan view illustration and corresponding cross-sectional illustrations are shown that more clearly illustrate how an actuator 530 is anchored to the organic substrate 505 with two actuation arms 552, according to an embodiment of the invention. As illustrated in FIG. 5A, actuation arms 552A and 552B are formed on opposite ends of an edge 558 of the first electrode 532. In an embodiment, the actuation arms 552 may be beams that extend out from the organic substrate 505 over the cavity 520. Each actuation arm 552 may include a stack that includes a portion of the piezo-electric layer 534 formed between a portion of the first electrode 532 and a portion of the second electrode 536. Referring now to FIG. 5B, a cross-sectional illustration along line 1-1' shows that a portion of the first electrode 532 also attaches to the organic substrate 505. Accordingly, the first electrode 532 may be a single continuous layer that has beam like portions that extend out from the organic substrate 505 and attach to a pad portion on which the mirror (not shown) may be placed or formed. In contrast, the second electrode 536 may be a discontinuous layer. For example, the first actuation arm 552A may include a first portion of the second electrode 536A and the second actuation arm 552B may include a second portion of the second electrode 536B. In an embodiment, the first portion 536A may be electrically isolated from the second portion 536B in order to allow for each actuation arm 552 to be controlled independently. Alternative embodiments may have the first portion 536A and the second portion 536B electrically coupled to each other and held at the same voltage.

Referring now to FIG. 5C along line 2-2', the piezo-electric layer 534 and the second portion of the second electrode 536B are not present. As such, a portion of the edge 558 of the first electrode 532 may be spaced away from the organic substrate 505. The portion of the first electrode 532 shown in FIG. 5C may be considered the pad portion of the actuator 530. While the pad portion of the first electrode 532 shown in FIG. 5C appears to be floating over the cavity 520, it is to be appreciated that the first electrode 532 is attached to the organic substrate 505 by the portion of the first electrode 532 that is a part of the actuation arms 552A and 552B (not visible in FIG. 5C).

Figure 6:
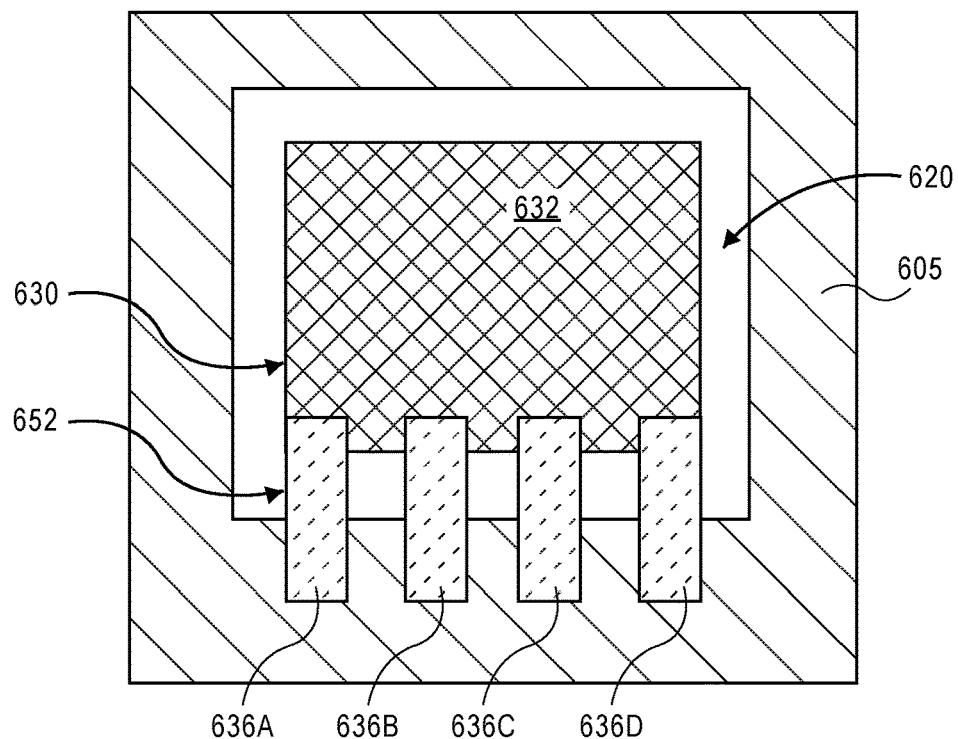
FIG. 6 is a plan view of a piezo-electric actuated structure that includes a plurality of actuation arms, according to an embodiment of the invention.

Referring now to FIG. 6, a plan view illustration is shown that more clearly illustrates how an actuator 630 is anchored to the organic substrate 605 with a plurality of actuation arms 652, according to an embodiment of the invention. The actuator 630 is substantially similar to the actuator 530 described above, with the exception that more than two actuation arms 652 are included. Similar to above, each portion of the second electrode 636A-636D may be electrically isolated and allow for independent control of each actuation arm 652 or they may be electrically coupled and actuated in unison.

Figure 7A:
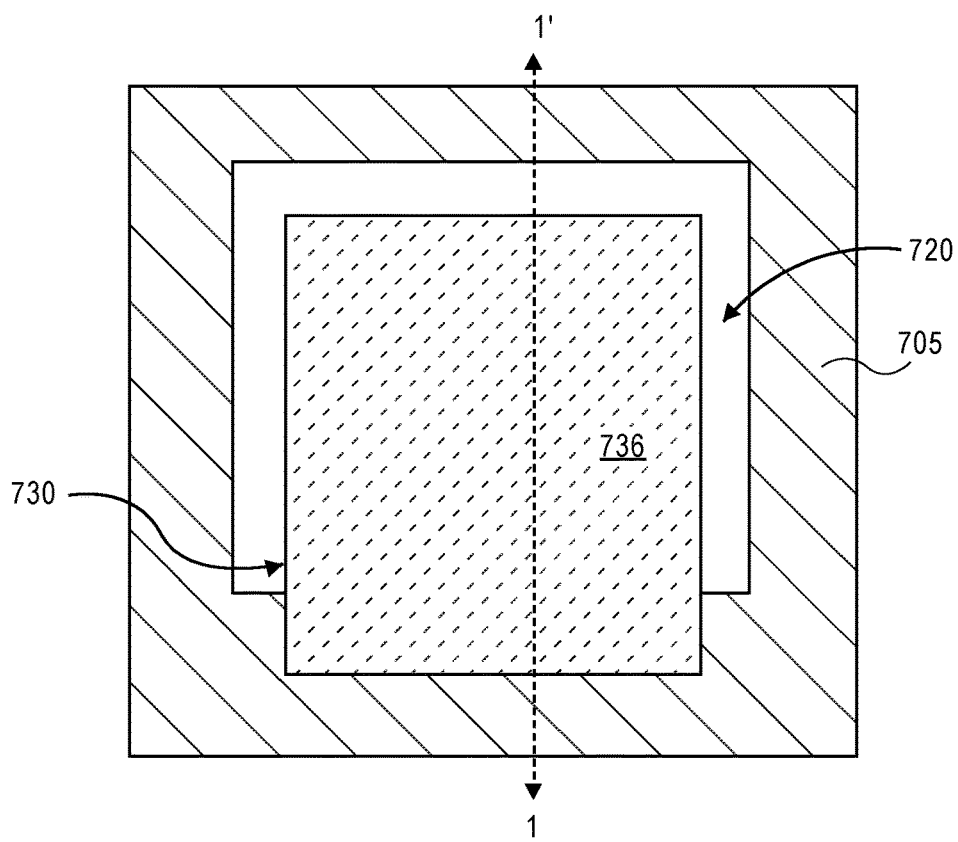
FIG. 7A is a plan view of a piezo-electric actuated structure, according to an embodiment of the invention.
Figure 7B:
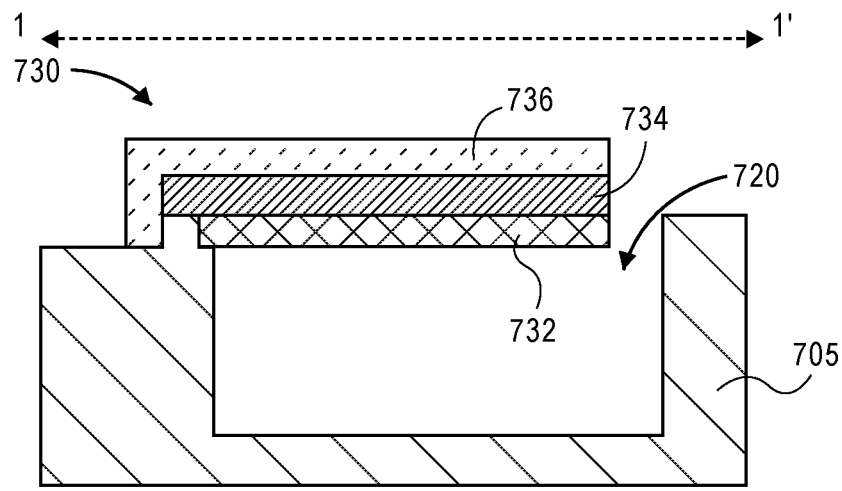
FIG. 7B is a cross-sectional illustration of the piezo-electric actuated structure in FIG. 7A along line 1-1', according to an embodiment of the invention.

Referring now to FIG. 7A, a plan view illustration of an actuator 730 is shown, according to an additional embodiment of the invention. As shown, the actuator 730 includes a second electrode 736 that extends completely over a top surface of the first electrode (not visible in FIG. 7A). In FIG. 7B, a cross-sectional illustration along line 1-1' shows that the piezo-electric layer 734 and the second electrode 736 extend along the complete length of the first electrode 732. The increased length of the piezo-electric layer 734 and the second electrode 736 allow for a greater deflection angle to be obtained with the same voltages, compared to the embodiments where the piezo-electric layer and the second electrode do not extend across the entire length of the first electrode.

Figure 8:
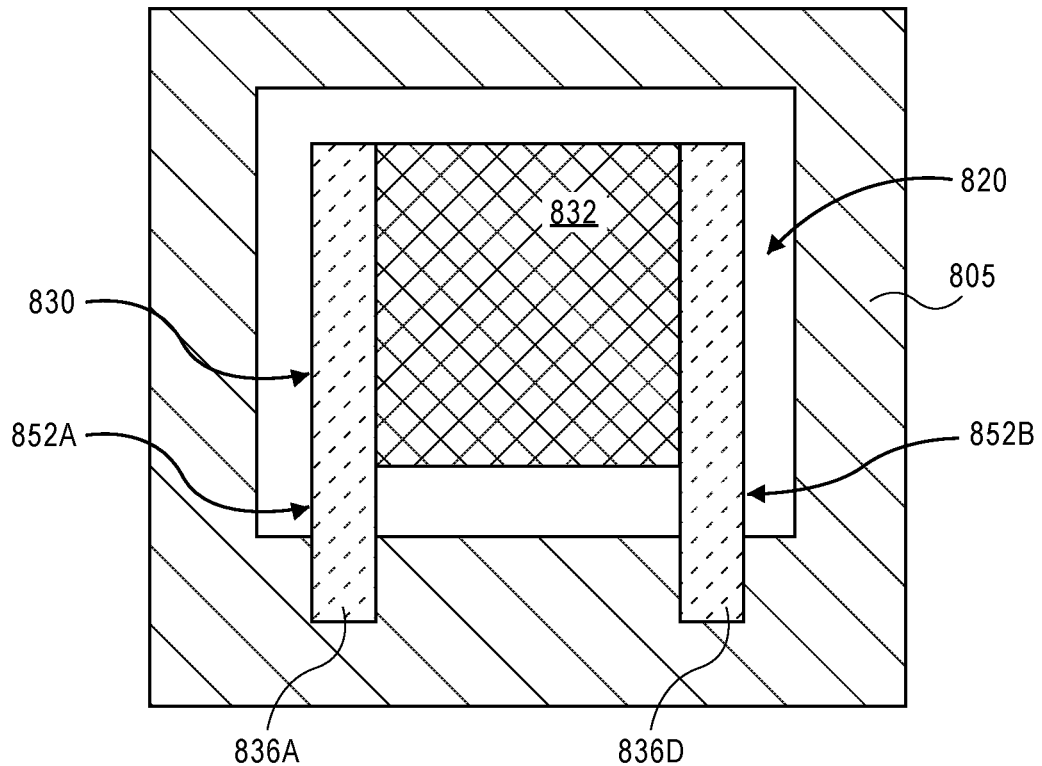
FIG. 8 is a plan view of a piezo-electric actuated structure with two actuation arms, according to an embodiment of the invention.
Figure 9:
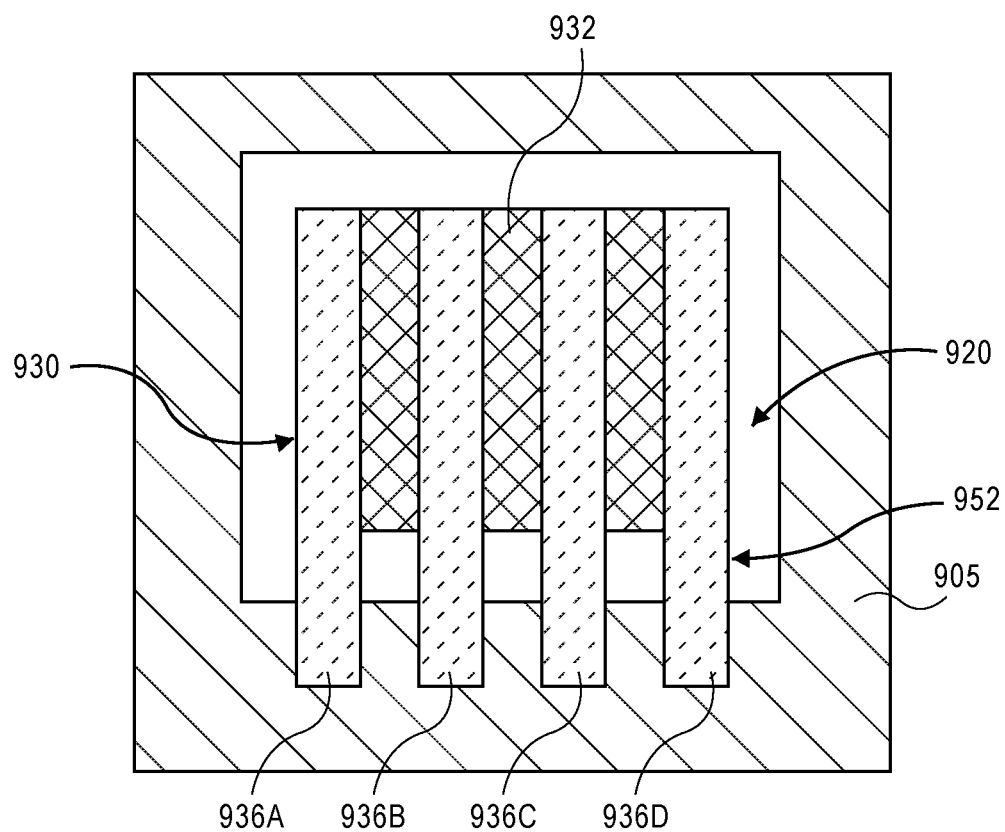
FIG. 9 is a plan view of a piezo-electric actuated structure with a plurality of actuation arms, according to an embodiment of the invention.

Referring now to FIG. 8, a plan view illustration of an actuator 830 is shown, according to an embodiment of the invention. The actuator 830 in FIG. 8 is substantially similar to the actuator 530 illustrated in FIG. 5A, with the exception that the actuation arms 852 extend substantially across the actuator 830. Similarly, the plan view illustration in FIG. 9 is an actuator 930 that is substantially similar to the actuator 630 illustrated in FIG. 6, with the exception that the actuation arms 952 extend substantially across the actuator 930.

Figure 10A:
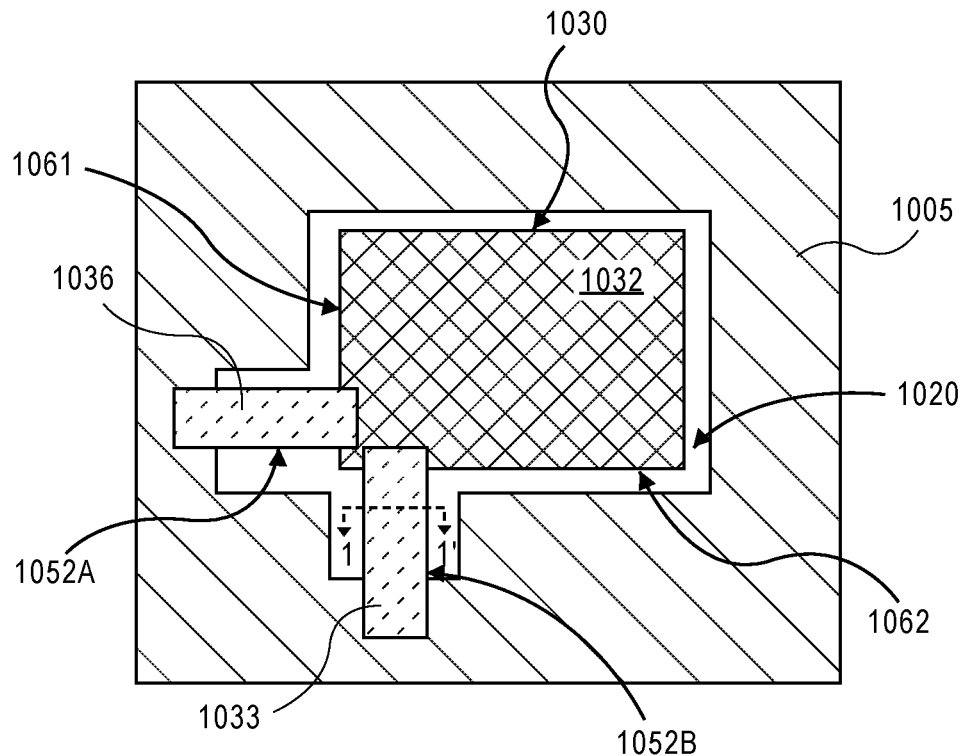
FIG. 10A is a plan view of a piezo-electric actuated structure with two actuation arms that are formed on different edges of the actuated structure, according to an embodiment of the invention.

According to an additional embodiment of the invention, the actuator may be deflected in more than one direction. One example of such an embodiment is illustrated in FIG. 10A. As illustrated, an actuator 1030 may have a first actuation arm 1052A formed along a first edge 1061 of the first electrode 1032 and a second actuation arm 1052B formed along a second edge 1062 of the first electrode 1032. According to an embodiment, the first actuation arm 1052A may include a second electrode 1036 that is formed over a piezo-electric layer (not shown) and the second actuation arm 1052B may include a third electrode 1033 that is also formed over a piezo-electric layer (not shown). According to an embodiment, the second electrode 1036 and the third electrode 1033 may be electrically isolated from each other and able to operate independently from each other. Accordingly, the actuator 1030 may be deflected about an axis substantially parallel to the first edge 1061 by the first actuation arm 1052A and about an axis substantially parallel to the second edge 1062 by the second actuation arm 1052B.

Figure 10B:
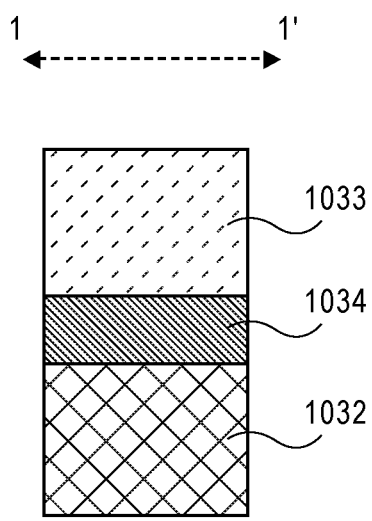
FIG. 10B is a cross-sectional illustration of the piezo-electric actuated structure in FIG. 10A along line 1-1', according to an embodiment of the invention.
Figure 10C:
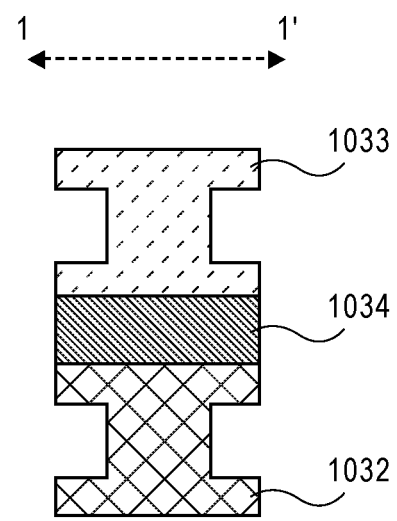
FIG. 10C is a cross-sectional illustration of the piezo-electric actuated structure in FIG. 10A along line 1-1', according to an additional embodiment of the invention.

According to an embodiment, the one or more actuation arms may also be formed with any desired cross-sectional shape. Altering the cross-section of the actuation arms allows for a desired stiffness to be obtained. For example, FIG. 10B illustrates a cross-sectional shape of the actuation arm 1052B along line 1-1' that is substantially rectangular. However, additional embodiments may include a cross-sectional shape that allows for increased stiffness and reduced weight. Such an embodiment is illustrated in FIG. 10C. As shown, the first electrode 1032 and the third electrode 1033 may be formed with an I-beam cross-section. Such a structure may be formed with multiple lithography and patterning operations during the fabrication of each electrode. While the different cross-sections are shown in FIGS. 10B and 10C, it is to be appreciated that the cross-sections of any actuation arms described herein may be non-rectangular as well. Also, while an I-beam shape is shown in FIG. 10C, it is to be appreciated that any cross-sectional shape may be used for the actuation arms (e.g., T-shaped, square, rectangular, stepped, etc.)

Figure 11A:
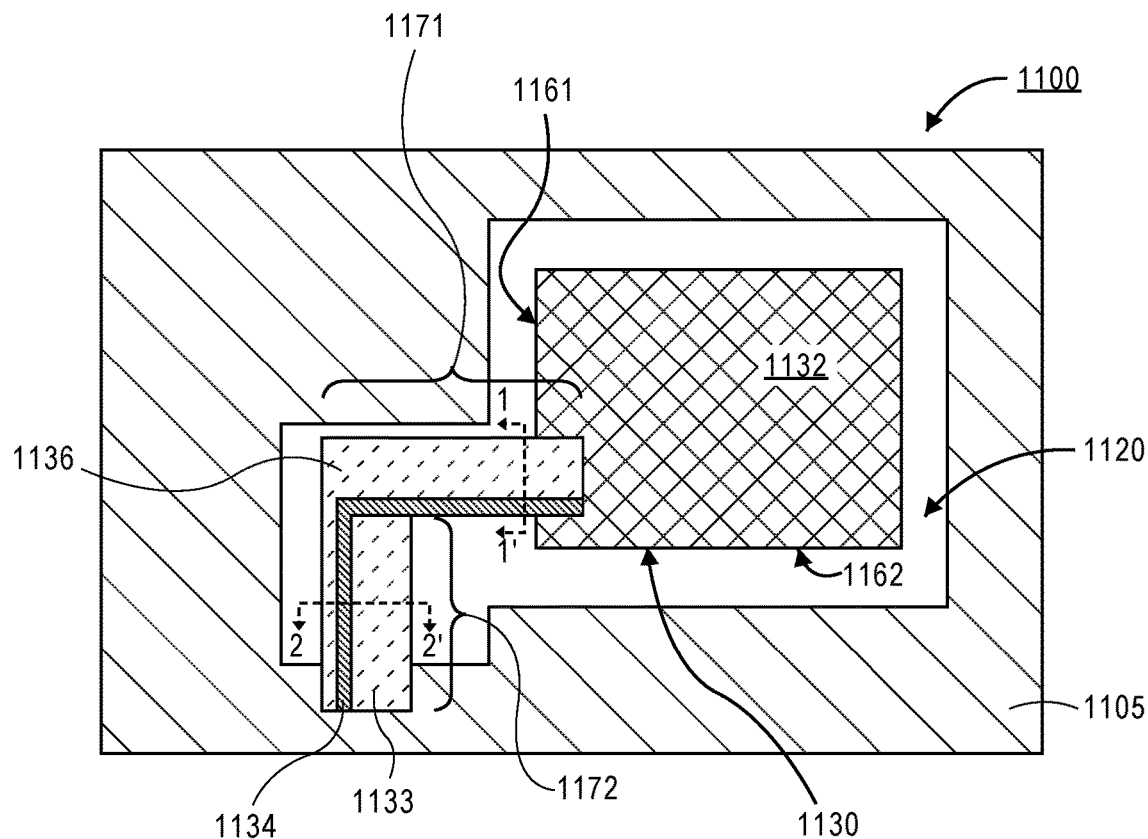
FIG. 11A is a plan view of a piezo-electric actuated structure that includes a single actuation arm that allows for deflection in multiple directions, according to an embodiment of the invention.

Referring now to FIG. 11A, a plan view illustration of a microelectronic package 1100 with an actuator 1130 that may be deflected in more than one direction is shown according to an additional embodiment of the invention. Instead of requiring two actuation arms that are attached to different edges of the first electrode 1132, embodiments of the invention may include an actuation arm that has a first length 1171 and a second length 1172. According to an embodiment, the second length 1172 may be substantially orthogonal to the first length 1171. In the illustrated embodiment, the first length 1171 may be actuated to deflect the actuator 1130 about an axis parallel to a first edge 1161, and the second length 1172 may be actuated to provide deflection of the actuator 1130 about an axis parallel to the second edge 1162. In order to isolate actuation to the different lengths of the actuation arm, a second electrode 1136 may be formed primarily along the first length 1171, and a third electrode 1133 may be formed along the second length 1172. In some embodiments, the second electrode 1136 may also extend along the second length 1172 in order to be electrically coupled to a contact on the organic substrate 1105. However, it is to be appreciated that the surface area of the third electrode 1133 over the piezo-electric layer 1134 in the second length 1172 is greater than the surface area of the second electrode 1136. As such, the actuation provided by the second length is primarily controlled by applying a voltage across the third electrode 1133 and the first electrode 1132, and the actuation provided by the first length 1171 is primarily controlled by applying a voltage across the second electrode 1136 and the first electrode 1132.

Figure 11B:
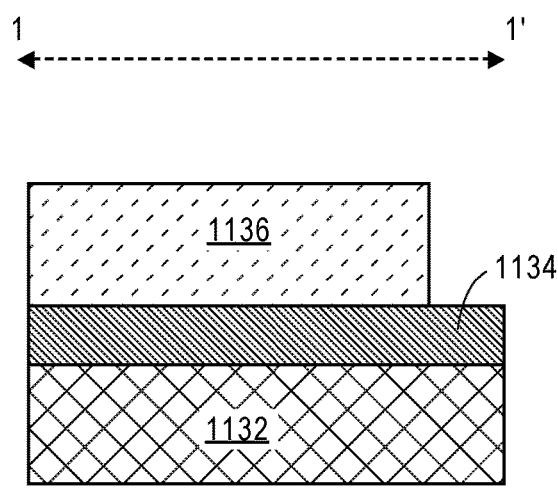
FIG. 11B is a cross-sectional illustration of an actuation arm in FIG. 11A along line 1-1', according to an embodiment of the invention.
Figure 11C:
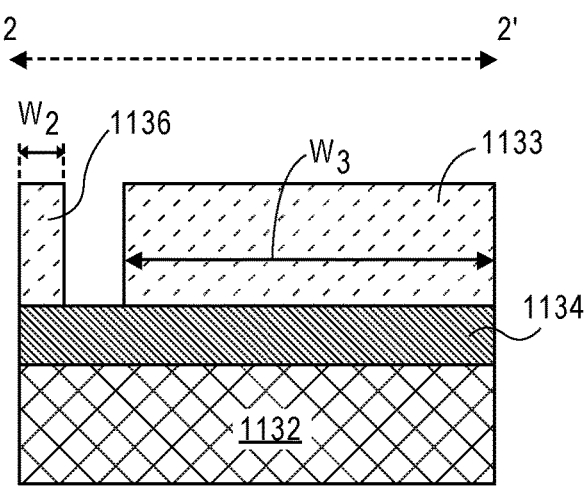
FIG. 11C is a cross-sectional illustration of an actuation arm in FIG. 11A along line 2-2', according to an embodiment of the invention.

Referring now to FIGS. 11B and 11C, cross-sectional views along the first length 1171 and the second length 1172 of the actuation arm are shown, according to an embodiment of the invention. As illustrated in FIG. 11B, a piezo-electric layer 1134 may be formed over the top surface of the first electrode 1132. Additionally, the first length 1171 of the actuation arm may only have the second electrode 1136 formed over the piezo-electric layer 1134. As such, when a voltage is applied across the second electrode 1136 and the first electrode 1132, the actuator 1130 will be deflected about an axis that is substantially perpendicular to the first length 1171 and out of plane. In FIG. 11C, the second electrode 1136 and the third electrode 1133 are formed over the top surface of the piezo-electric layer 1134. However, since the width $W_3$ of the third electrode 1133 is greater than the width $W_2$ of the second electrode 1136, the third electrode 1133 will provide the majority of the actuation force on the actuation arm along the second length 1172 of the actuation arm. The portion of the second electrode 1136 that extends along the second length 1172 of the actuation arm may be made as narrow as possible in order to minimize the effect on the actuation of the second length 1172. As such, when a voltage is applied across the third electrode 1133 and the first electrode 1132, the actuator 1130 will be deflected about an axis that is substantially perpendicular to the second length 1172 and out of plane.

Figure 12:
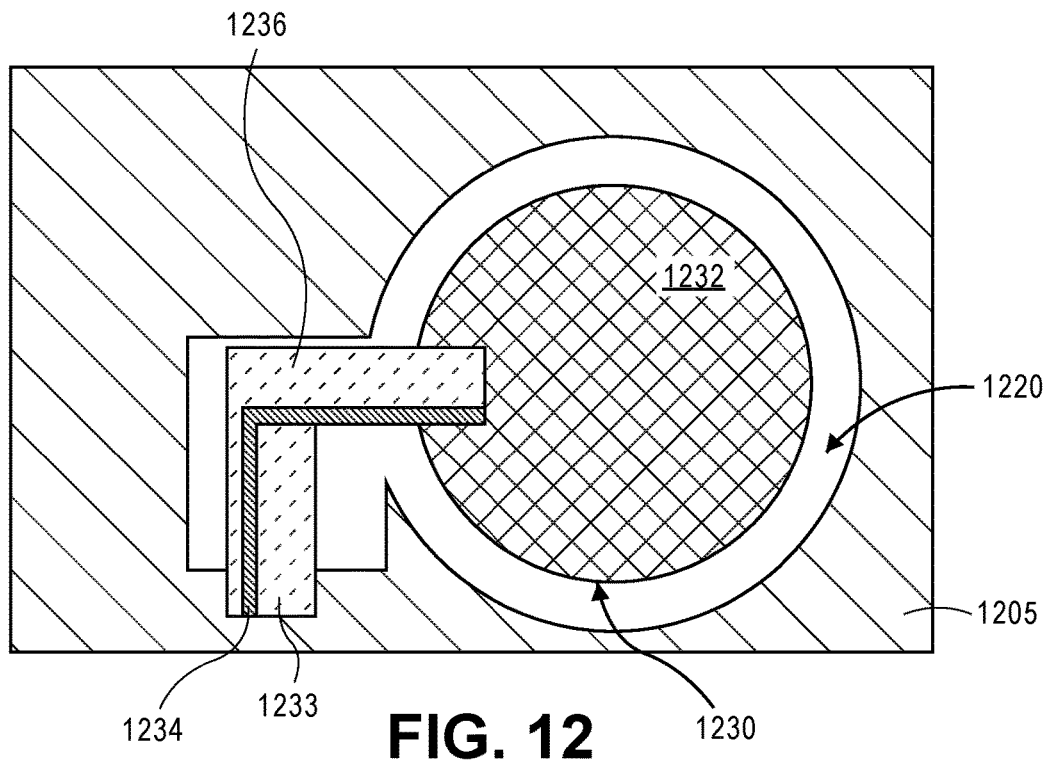
FIG. 12 is a plan view of a piezo-electric actuated structure with a circular pad region, according to an embodiment of the invention.

While the embodiments described herein have included actuators with substantially rectangular shaped pads for supporting the mirrors, it is to be appreciated that embodiments are not limited to such configurations. For example, FIG. 12 illustrates a microelectronic package that includes an actuator 1230 that has a substantially circular pad for supporting a mirror. For example, the first electrode 1232 includes a substantially circular perimeter in the pad region. The use of a circular shaped pad may allow for the elimination of corner reflection effects that may be experienced when rectangular shaped pads are used. Additionally, it is to be appreciated that embodiments of the invention may also include an actuator with a piezo-electric layer and a second electrode that cover the entire top surface of the first electrode, and which are substantially circular as well. Alternatively, the second electrode and third electrode may cover only the arm of the actuator and not the circular pad, as shown in FIG. 12. Furthermore, embodiments may include a substantially circular shaped pad in combination with any of the actuation arm configurations described herein (e.g., single arm, multi-arm, multi-arm with multiple axis deflection, single-arm with multiple axis deflection, etc.)

Figure 13A:
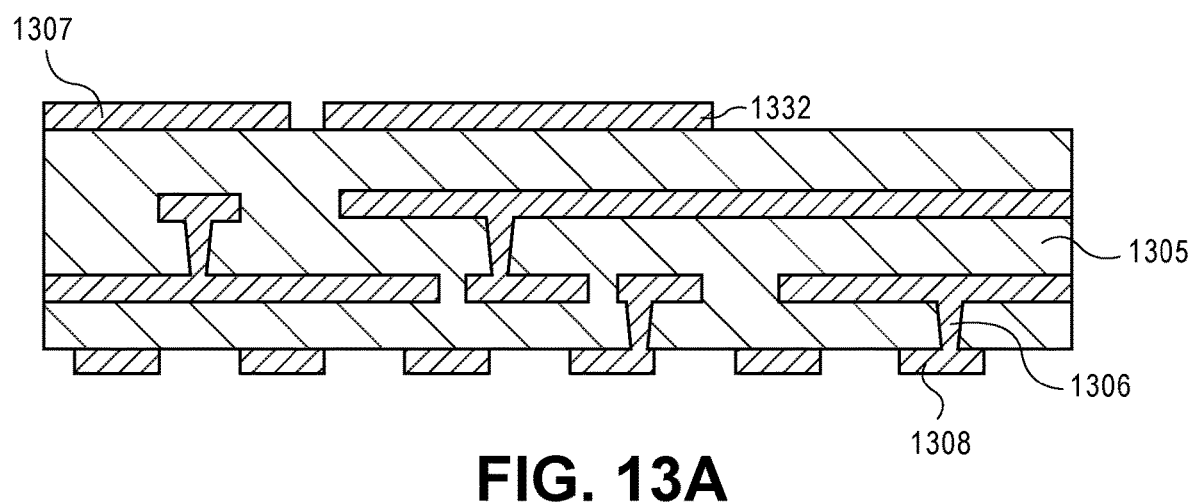
FIG. 13A is a cross-sectional illustration of an organic substrate after the first electrode has been formed, according to an embodiment of the invention.

Referring now to FIGS. 13A-13E, a process flow for forming an actuator in an organic substrate is shown according to an embodiment of the invention. Referring now to FIG. 13A, the first electrode 1332 is formed over a top surface of an organic substrate 1305. According to an embodiment, the first electrode 1332 may be formed with manufacturing processes known in the semiconductor and substrate manufacturing industries, such as semi-additive processing, subtractive processing, or the like.

Figure 13B:
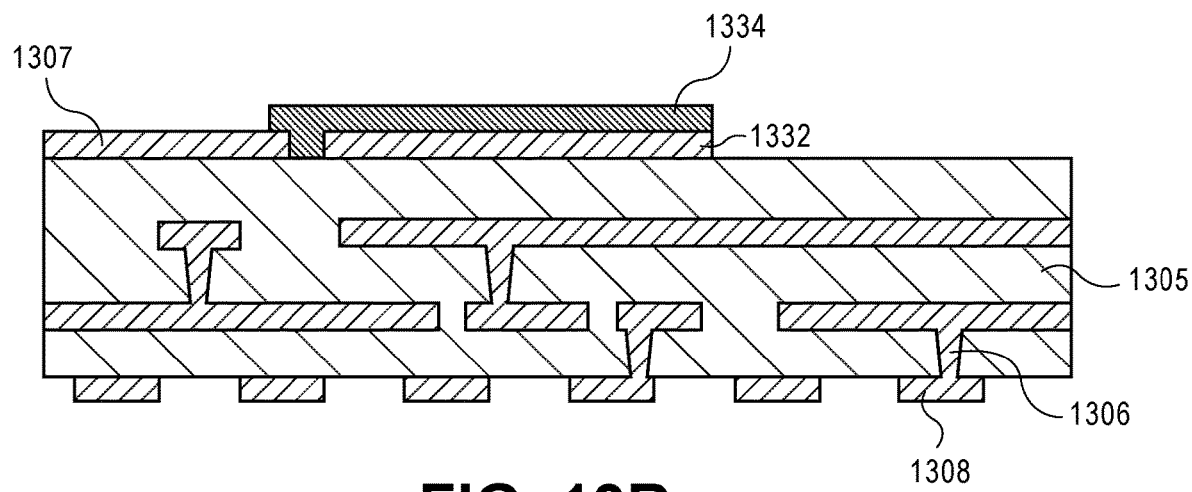
FIG. 13B is a cross-sectional illustration of the organic substrate after the piezo-electric layer has been formed, according to an embodiment of the invention.

Referring now to FIG. 13B, a piezo-electric material may be formed over the first electrode 1132 to form a piezo-electric layer 1334. According to an embodiment, the piezo-electric layer may be deposited in an amorphous phase. In order to improve the piezo-electric properties of the piezo-electric layer 1334, the amorphous layer may be crystallized with a laser annealing process. According to an embodiment, the pulsed laser annealing process may use an excimer laser with an energy density between approximately 10-100 mJ/cm$^2$ and a pulsewidth between approximately 10-50 nanoseconds. For example, the piezo-electric layer 1334 may be deposited with a sputtering process, an ink jetting process, or the like. According to an embodiment, the piezo-electric layer 1334 may be PZT, KNN, ZnO, or combinations thereof. In an embodiment, the laser annealing process may be a pulsed laser anneal and implemented so that the temperature of the organic substrate 1305 does not exceed approximately 260° C.

Figure 13C:
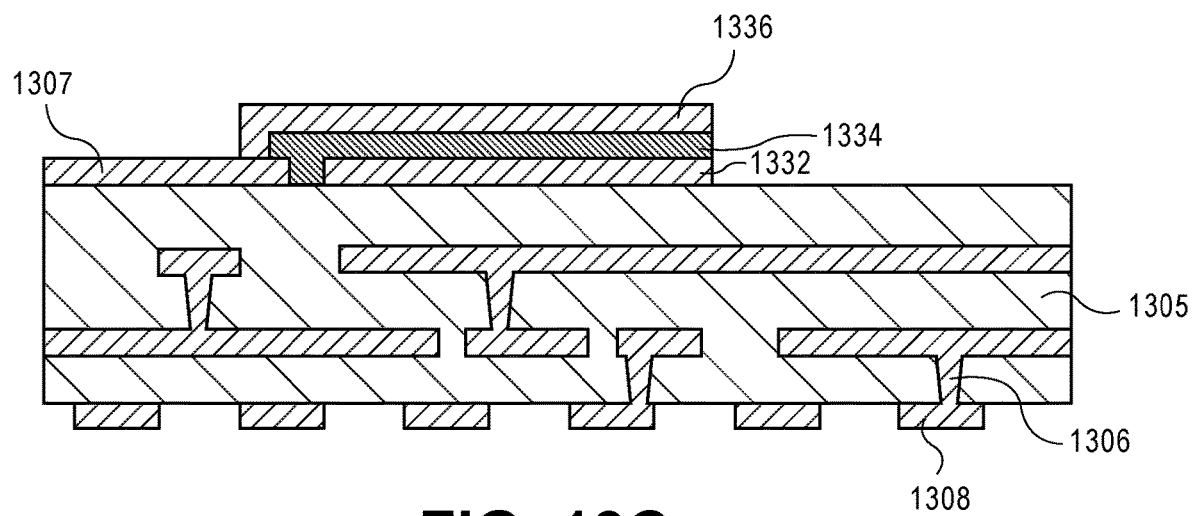
FIG. 13C is a cross-sectional illustration of the organic substrate after the second electrode has been formed, according to an embodiment of the invention.

Referring now to FIG. 13C, a second electrode 1336 may be formed over the piezo-electric layer 1334. According to an embodiment, the second electrode 1336 may be formed with damascene processes, electrolytic plating, electroless plating, sputtering, evaporation, or other forming processes. As illustrated, the second electrode 1336 may be electrically coupled to a conductive trace 1307 on the organic substrate 1305 that is electrically isolated from the first electrode 1332. Accordingly, a voltage may be applied across the first electrode 1332 and the second electrode 1336. Furthermore, it is to be appreciated that additional electrodes may be formed over the piezo-electric layer 1334 in order to provide additional actuation arms that allow for deflection of the actuator about more than one axis.

Figure 13D:
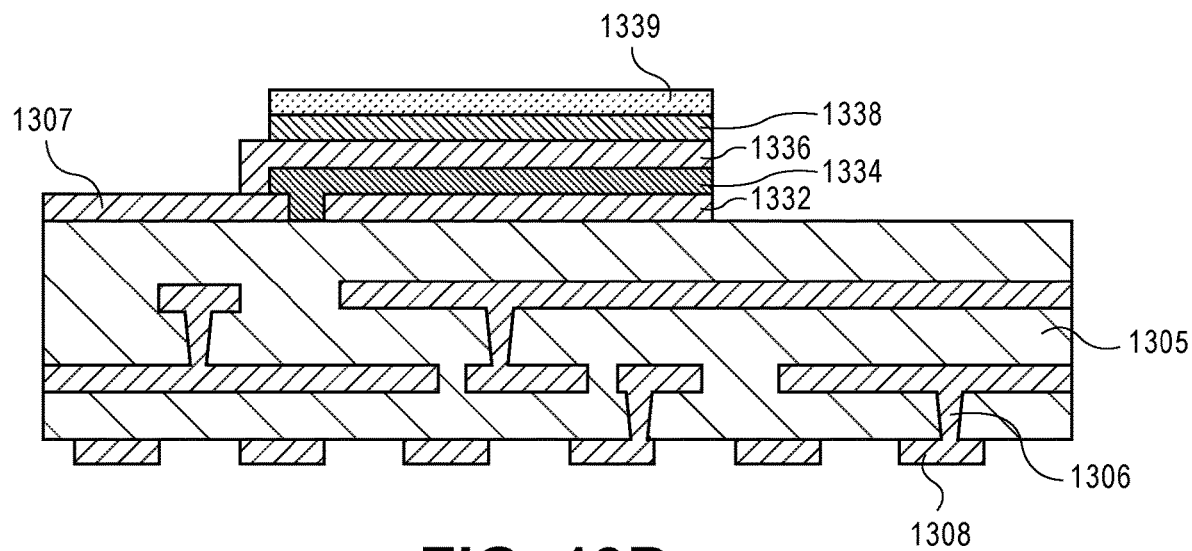
FIG. 13D is a cross-sectional illustration of the organic substrate after the mirror has been formed, according to an embodiment of the invention.

Referring now to FIG. 13D, a mirror 1338 may be formed over the second electrode 1336. According to an embodiment, the mirror 1338 may be formed by depositing and patterning a layer of reflective material (e.g., silver, aluminum, tin, gold, etc.). For example, the deposition process may be a sputtering, evaporation, or other suitable deposition process that is compatible with organic substrates. In some embodiments a protective coating 1339 may also be deposited over the mirror 1338 in order to prevent oxidation or other damage.

Figure 13E:
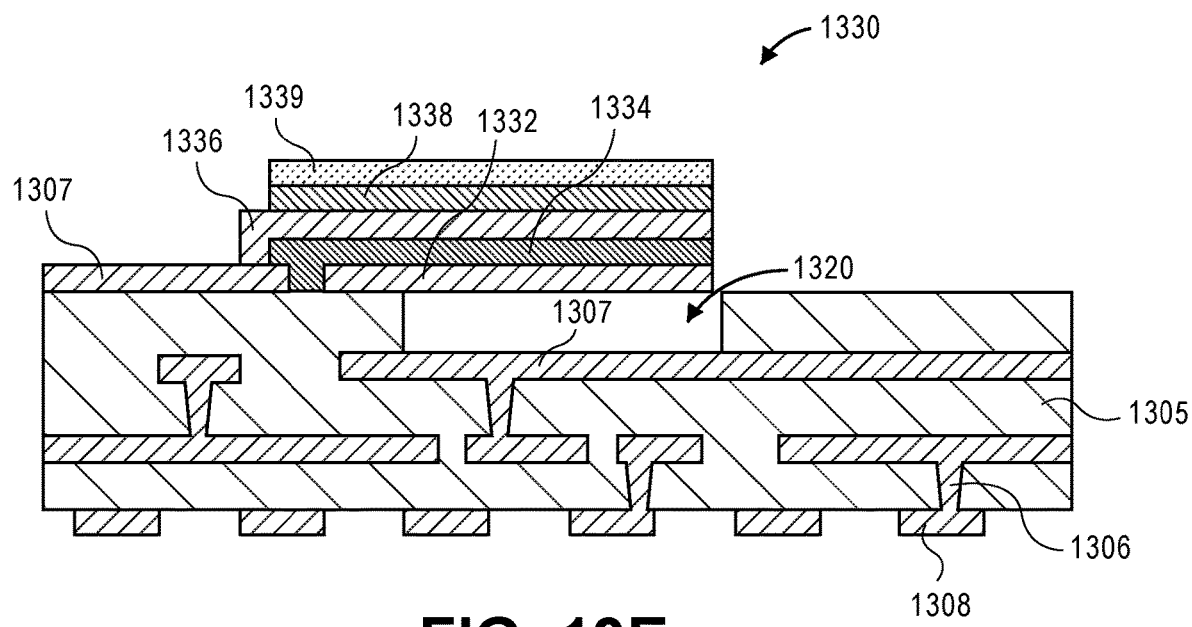
FIG. 13E is a cross-sectional illustration of the organic substrate after a cavity is formed in the organic substrate below the actuator, according to an embodiment of the invention.

Referring now to FIG. 13E, the actuator 1330 is released from the organic substrate 1305 in order to allow for actuation. The actuator 1330 may be released by forming a cavity 1320 below a portion of the first electrode 1332. For example, the cavity may be formed with a photolithographic and etching process that selectively removes a portion of the organic substrate 1305. For example, the etching process may be a reactive ion etching process, or any other wet or dry etching process. In embodiments where the pad region is too large to allow for adequate removal of the organic substrate 1305 below the pad, one or more holes may be formed through the actuator 1330 to allow for the chemistry of the etching process to pass through the actuator 1330 and remove the organic substrate 1305 below. As illustrated, embodiments may use a trace 1307 as an etch-stop layer to provide the desired depth of the cavity.

While the process for forming the actuator in FIGS. 13A-13E illustrate an actuator similar to the one described above with respect to FIG. 1A, it is to be appreciated that substantially similar operations may be used to form any of the actuators described herein. For example, the formation of the piezo-electric layer 1334 and the second electrode 1336 may be modified such that a portion of the first electrode 1332 remains exposed and the mirror 1338 is formed over the first electrode 1332, similar to the actuator described with respect to FIG. 2A. Additional embodiments may include forming the mirror with a discrete die that is mounted to the actuator 1330 instead of being deposited, similar to the device described above with respect to FIG. 3. Additionally, it is to be appreciated that one or more actuation arms may be defined with the patterning and deposition processes as well.

Figure 14:
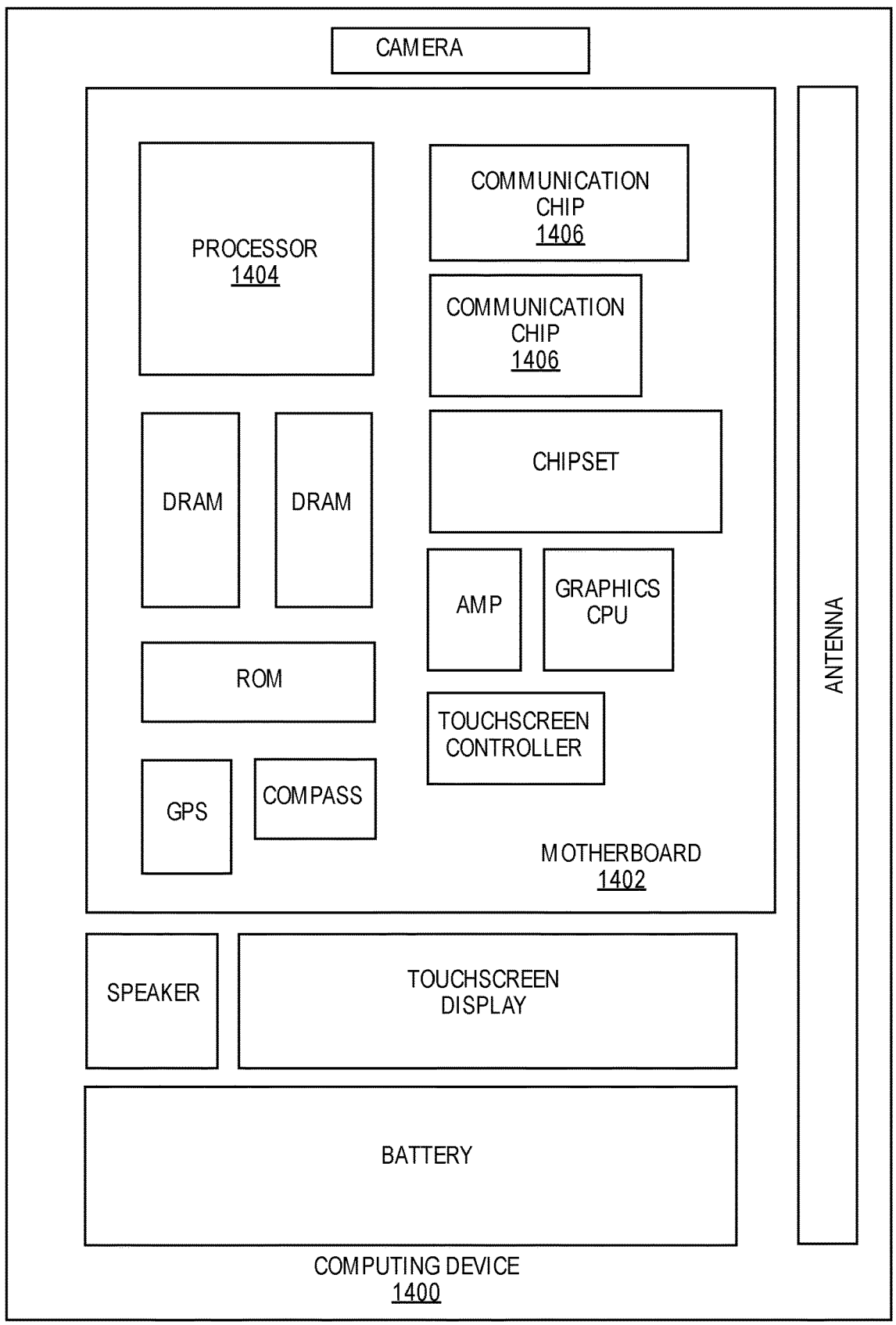
FIG. 14 is a schematic of a computing device built in accordance with an embodiment of the invention.

FIG. 14 illustrates a computing device 1400 in accordance with one implementation of the invention. The computing device 1400 houses a board 1402. The board 1402 may include a number of components, including but not limited to a processor 1404 and at least one communication chip 1406. The processor 1404 is physically and electrically coupled to the board 1402. In some implementations the at least one communication chip 1406 is also physically and electrically coupled to the board 1402. In further implementations, the communication chip 1406 is part of the processor 1404.

Depending on its applications, computing device 1400 may include other components that may or may not be physically and electrically coupled to the board 1402. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1406 enables wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1406 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1400 may include a plurality of communication chips 1406. For instance, a first communication chip 1406 may be dedicated to shorter range wireless communications such as Wi-Fi and Bluetooth and a second communication chip 1406 may be dedicated to longer range wireless communications such as GPS, EDGE, GPRS, CDMA, WiMAX, LTE, Ev-DO, and others.

The processor 1404 of the computing device 1400 includes an integrated circuit die packaged within the processor 1404. In some implementations of the invention, the integrated circuit die of the processor may be packaged on an organic substrate and provide electrical inputs for actuating one or more piezo-electrically actuated mirrors, in accordance with implementations of the invention. The term "processor" may refer to any device or portion of a device that processes electronic data from registers and/or memory to transform that electronic data into other electronic data that may be stored in registers and/or memory.

The communication chip 1406 also includes an integrated circuit die packaged within the communication chip 1406. In accordance with another implementation of the invention, the integrated circuit die of the communication chip may be packaged on an organic substrate that includes one or more piezo-electrically actuated mirrors, in accordance with implementations of the invention.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Embodiments of the invention include piezo-electric actuated structure, comprising: an organic substrate; an actuator anchored to the organic substrate, wherein the actuator comprises: a first electrode; a piezo-electric layer formed on the first electrode; and a second electrode formed on the piezo-electric layer; and a mirror formed on the actuator.

Additional embodiments of the invention include a piezo-electric actuated structure, wherein the mirror is formed on the second electrode.

Additional embodiments of the invention include a piezo-electric actuated structure, wherein the actuator includes one or more actuation arms, and wherein the actuator is anchored to the organic substrate by the one or more actuation arms.

Additional embodiments of the invention include a piezo-electric actuated structure, wherein the piezo-electric layer and the second electrode do not extend past the actuation arms.

Additional embodiments of the invention include a piezo-electric actuated structure, wherein the mirror is formed on the first electrode.

Additional embodiments of the invention include a piezo-electric actuated structure, wherein a first actuation arm deflects the actuator about a first axis and a second actuation arm deflects the actuator about a second axis.

Additional embodiments of the invention include a piezo-electric actuated structure, wherein a first actuation arm has a first length for deflecting the actuator about a first axis and a second length oriented substantially perpendicular to the first length for deflecting the actuator about a second axis.

Additional embodiments of the invention include a piezo-electric actuated structure, wherein the first and second electrodes are formed along the first and second lengths of the first actuation arm, a third electrode is formed on the second length, and wherein a surface area of the third electrode over the second length is greater than a surface area of the second electrode over the second length.

Additional embodiments of the invention include a piezo-electric actuated structure, wherein the mirror includes a reflective layer and a protective coating over the reflective layer.

Additional embodiments of the invention include a piezo-electric actuated structure, wherein the mirror is a discrete component attached to the actuator by a bonding layer.

Additional embodiments of the invention include a piezo-electric actuated structure, wherein the mirror has a reflective surface with a surface roughness of less than approximately 100 nm.

Embodiments of the invention include a method of forming a piezo-electric actuated structure, comprising: forming a first electrode over an organic substrate; depositing a piezo-electric layer over the first electrode, wherein the piezo-electric layer is an amorphous layer; crystallizing the piezo-electric layer with a pulsed laser anneal, wherein a temperature of the organic substrate does not exceed 260° C.; forming a second electrode over a top surface of the piezo-electric layer; forming a mirror above a pad portion of the first electrode; and forming a cavity below a portion of the first electrode.

Additional embodiments of the invention include a method of forming a piezo-electric actuated structure, wherein the piezo-electric layer is deposited with a sputtering or ink-jetting process.

Additional embodiments of the invention include a method of forming a piezo-electric actuated structure, wherein the cavity is formed with a reactive ion etching process, and wherein an etch-stop layer is formed in the organic substrate below the first electrode.

Additional embodiments of the invention include a method of forming a piezo-electric actuated structure, wherein the piezo-electric layer and the second electrode do not completely cover a top surface of the first electrode.

Additional embodiments of the invention include a method of forming a piezo-electric actuated structure, wherein the mirror is formed on the first electrode.

Additional embodiments of the invention include a method of forming a piezo-electric actuated structure, wherein the mirror is a die that is mounted to the first electrode with a bonding layer.

Embodiments of the invention include a microelectronic package, comprising: an organic substrate; a cavity formed in the organic substrate; an actuator anchored to the organic substrate and extending over the cavity, wherein the actuator comprises: a first electrode; a piezo-electric layer formed on the first electrode; and a second electrode formed on the piezo-electric layer; and a mirror formed on the actuator.

Additional embodiments of the invention include a microelectronic package, further comprising a processor packaged on the organic substrate, wherein the processor provides electrical inputs for actuating the actuator.

Additional embodiments of the invention include a microelectronic package, wherein an etch-stop layer is formed at the bottom of the cavity.

Additional embodiments of the invention include a microelectronic package, further comprising a plurality of actuators anchored to the organic substrate and extending over the cavity.

Embodiments of the invention include a microelectronic package, comprising: an organic substrate; a cavity formed in the organic substrate; an actuator anchored to the organic substrate and extending over the cavity, wherein the actuator comprises: a first electrode; a piezo-electric layer formed on the first electrode; and a second electrode formed on the piezo-electric layer, wherein the actuator includes one or more actuation arms, and wherein the actuator is anchored to the organic substrate by the one or more actuation arms; and a mirror formed on the actuator.

Additional embodiments of the invention include a microelectronic package, wherein a first actuation arm deflects the actuator about a first axis and a second actuation arm deflects the actuator about a second axis.

Additional embodiments of the invention include a microelectronic package, wherein a first actuation arm has a first length for deflecting the actuator about a first axis and a second length oriented substantially perpendicular to the first length for deflecting the actuator about a second axis, and wherein the first and second electrodes are formed along the first and second length of the first actuation arm, a third electrode is formed on the second length, and wherein a surface area of the third electrode over the second length is greater than a surface area of the second electrode over the second length.

Additional embodiments of the invention include a microelectronic package, wherein the mirror is a die attached to the actuator by a bonding layer.

What is claimed is:

1. A piezo-electric actuated structure, comprising:
   an organic substrate;
   an actuator anchored to the organic substrate, wherein the actuator comprises:
      a first electrode;
      a piezo-electric layer formed on the first electrode and contacting the organic substrate; and
      a second electrode formed on the piezo-electric layer; and
   a mirror formed on the actuator.

2. The piezo-electric actuated structure of claim 1, wherein the mirror is formed on the second electrode.

3. The piezo-electric actuated structure of claim 1, wherein the actuator includes one or more actuation arms, and wherein the actuator is anchored to the organic substrate by the one or more actuation arms.

4. The piezo-electric actuated structure of claim 3, wherein the piezo-electric layer and the second electrode do not extend past the actuation arms.

5. The piezo-electric actuated structure of claim 4, wherein the mirror is formed on the first electrode.

6. The piezo-electric actuated structure of claim 3, wherein a first actuation arm deflects the actuator about a first axis and a second actuation arm deflects the actuator about a second axis.

7. The piezo-electric actuated structure of claim 3, wherein a first actuation arm has a first length for deflecting the actuator about a first axis and a second length oriented substantially perpendicular to the first length for deflecting the actuator about a second axis.

8. The piezo-electric actuated structure of claim 7, wherein the first and second electrodes are formed along the first and second lengths of the first actuation arm, a third electrode is formed on the second length, and wherein a surface area of the third electrode over the second length is greater than a surface area of the second electrode over the second length.

9. The piezo-electric actuated structure of claim 1, wherein the mirror includes a reflective layer and a protective coating over the reflective layer.

10. The piezo-electric actuated structure of claim 1, wherein the mirror is a discrete component attached to the actuator by a bonding layer.

11. The piezo-electric actuated structure of claim 10, wherein the mirror has a reflective surface with a surface roughness of less than approximately 100 nm.

12. A method of forming a piezo-electric actuated structure, comprising:
   forming a first electrode over an organic substrate;
   depositing a piezo-electric layer over the first electrode, wherein the piezo-electric layer is an amorphous layer;
   crystallizing the piezo-electric layer with a pulsed laser anneal, wherein a temperature of the organic substrate does not exceed 260° C.;
   forming a second electrode over a top surface of the piezo-electric layer;
   forming a mirror above a pad portion of the first electrode; and
   forming a cavity below a portion of the first electrode.

13. The method of claim 12, wherein the piezo-electric layer is deposited with a sputtering or ink-jetting process.

14. The method of claim 12, wherein the cavity is formed with a reactive ion etching process, and wherein an etch-stop layer is formed in the organic substrate below the first electrode.

15. The method of claim 12, wherein the piezo-electric layer and the second electrode do not completely cover a top surface of the first electrode.

16. The method of claim 15, wherein the mirror is formed on the first electrode.

17. The method of claim 16, wherein the mirror is a die that is mounted to the first electrode with a bonding layer.

18. A microelectronic package, comprising:
   an organic substrate;
   a cavity formed in the organic substrate;
   an actuator anchored to the organic substrate and extending over the cavity, wherein the actuator comprises:
      a first electrode;
      a piezo-electric layer formed on the first electrode and contacting the organic substrate; and
      a second electrode formed on the piezo-electric layer; and
   a mirror formed on the actuator.

19. The microelectronic package of claim 18, further comprising a processor packaged on the organic substrate, wherein the processor provides electrical inputs for actuating the actuator.

20. The microelectronic package of claim 18, wherein an etch-stop layer is formed at the bottom of the cavity.

21. The microelectronic package of claim 18, further comprising a plurality of actuators anchored to the organic substrate and extending over the cavity.

22. A microelectronic package, comprising:
   an organic substrate;
   a cavity formed in the organic substrate;
   an actuator anchored to the organic substrate and extending over the cavity, wherein the actuator comprises:
      a first electrode;
      a piezo-electric layer formed on the first electrode and contacting the organic substrate; and
      a second electrode formed on the piezo-electric layer, wherein the actuator includes one or more actuation arms, and wherein the actuator is anchored to the organic substrate by the one or more actuation arms; and
   a mirror formed on the actuator.

23. The microelectronic package of claim 22, wherein a first actuation arm deflects the actuator about a first axis and a second actuation arm deflects the actuator about a second axis.

24. The microelectronic package of claim 22, wherein a first actuation arm has a first length for deflecting the actuator about a first axis and a second length oriented substantially perpendicular to the first length for deflecting the actuator about a second axis, and wherein the first and second electrodes are formed along the first and second length of the first actuation arm, a third electrode is formed on the second length, and wherein a surface area of the third electrode over the second length is greater than a surface area of the second electrode over the second length.

25. The microelectronic package of claim 22, wherein the mirror is a die attached to the actuator by a bonding layer.

\* \* \* \* \*